(12) United States Patent
Koizumi et al.

(10) Patent No.: US 10,068,940 B2
(45) Date of Patent: Sep. 4, 2018

(54) IMAGING APPARATUS WITH FOCUS-RANGING PRECISION IN ONE DIRECTION DUE TO SATURATED PHOTOELECTRIC CONVERSION ELEMENTS LOCATED ADJACENT TO EACH OTHER

(71) Applicant: CANON KABUSHIKI KAISHA, Tokyo (JP)

(72) Inventors: Satoshi Koizumi, Kawasaki (JP); Masahiro Kobayashi, Tokyo (JP)

(73) Assignee: CANON KABUSHIKI KAISHA, Tokyo (JP)

(*) Notice: Subject to any disclaimer, the term of this patent is extended or adjusted under 35 U.S.C. 154(b) by 0 days.

(21) Appl. No.: 15/450,838

(22) Filed: Mar. 6, 2017

(65) Prior Publication Data

US 2017/0263664 A1   Sep. 14, 2017

(30) Foreign Application Priority Data

Mar. 9, 2016   (JP) ................. 2016-045994

(51) Int. Cl.
*H01L 27/146* (2006.01)
*H04N 5/378* (2011.01)
(52) U.S. Cl.
CPC .. *H01L 27/14627* (2013.01); *H01L 27/14607* (2013.01); *H01L 27/14621* (2013.01); *H01L 27/14636* (2013.01); *H01L 27/14645* (2013.01); *H04N 5/378* (2013.01)

(58) Field of Classification Search
CPC ......... H01L 27/14627; H01L 27/14601; H01L 27/146; H01L 27/14607; H01L 27/14605; H01L 27/14603; H01L 27/14636; H01L 27/14645
See application file for complete search history.

(56) References Cited

U.S. PATENT DOCUMENTS

| | | | |
|---|---|---|---|
| 7,176,507 B2* | 2/2007 | Ihara | ................. H01L 27/14603 257/233 |
| 9,299,739 B2* | 3/2016 | Kobayashi | .............. H01L 31/02 |
| 2014/0146197 A1 | 5/2014 | Okuzawa et al. | |
| 2017/0229599 A1* | 8/2017 | Sakata | ................ H01L 31/1075 |

FOREIGN PATENT DOCUMENTS

| | | |
|---|---|---|
| JP | 2013-149743 A | 8/2013 |
| JP | 2014-107835 A | 6/2014 |
| JP | 2015-162658 A | 9/2015 |

* cited by examiner

*Primary Examiner* — Andrew Q Tran
(74) *Attorney, Agent, or Firm* — Canon U.S.A., Inc. IP Division

(57) ABSTRACT

An imaging apparatus includes a micro lens, a second photoelectric conversion element that is located adjacent to a first photoelectric conversion element in a first direction, and a third photoelectric conversion element that is located adjacent to the first photoelectric conversion in a second direction intersecting with the first direction, wherein the height of a potential barrier produced at a region between the first and third photoelectric conversion elements against a signal charge is less than the height of a potential barrier produced at a region between the first and second photoelectric conversion elements against a signal charge.

23 Claims, 9 Drawing Sheets

IMAGING APPARATUS WITH FOCUS-RANGING PRECISION IN ONE DIRECTION DUE TO SATURATED PHOTOELECTRIC CONVERSION ELEMENTS LOCATED ADJACENT TO EACH OTHER

BACKGROUND

Field

Embodiments of the disclosure relate to an imaging apparatus.

Description of the Related Art

In some cases, signals produced by plural photoelectric conversion elements are processed as one pixel signal in a solid state imager. An example of a technique used for such processing is disclosed in Japanese Patent Laid-Open No. 2013-149743. By lowering a potential barrier between plural photoelectric conversion elements, the technique disclosed in said publication makes it possible to obtain a proper signal even if there is any difference in sensitivity or in the amount of incident light between the plural photoelectric conversion elements.

SUMMARY

An imaging apparatus includes a plurality of first photoelectric conversion units. Each of the plurality of first photoelectric conversion units includes one micro lens, first, second, and third photoelectric conversion elements, and fourth and fifth semiconductor regions. The first photoelectric conversion element includes a first semiconductor region that accumulates a signal charge. The first semiconductor region has a first conductivity type. The second photoelectric conversion element includes a second semiconductor region that accumulates a signal charge. The second semiconductor region is located next to the first semiconductor region in a first direction. The second semiconductor region has the first conductivity type. The third photoelectric conversion element includes a third semiconductor region that accumulates a signal charge. The third semiconductor region is located next to the first semiconductor region in a second direction intersecting with the first direction. The third semiconductor region has the first conductivity type. The fourth semiconductor region is located between the first semiconductor region and the second semiconductor region and has a second conductivity type. The fifth semiconductor region is located between the first semiconductor region and the third semiconductor region and has the second conductivity type. The first photoelectric conversion element, the second photoelectric conversion element, and the third photoelectric conversion element are arranged at positions where light condensed by the one micro lens enters. The length of the fifth semiconductor region in the second direction is less than the length of the fourth semiconductor region in the first direction.

Further features of the disclosure will become apparent from the following description of exemplary embodiments with reference to the attached drawings.

DESCRIPTION OF THE EMBODIMENTS

Figure 1A:
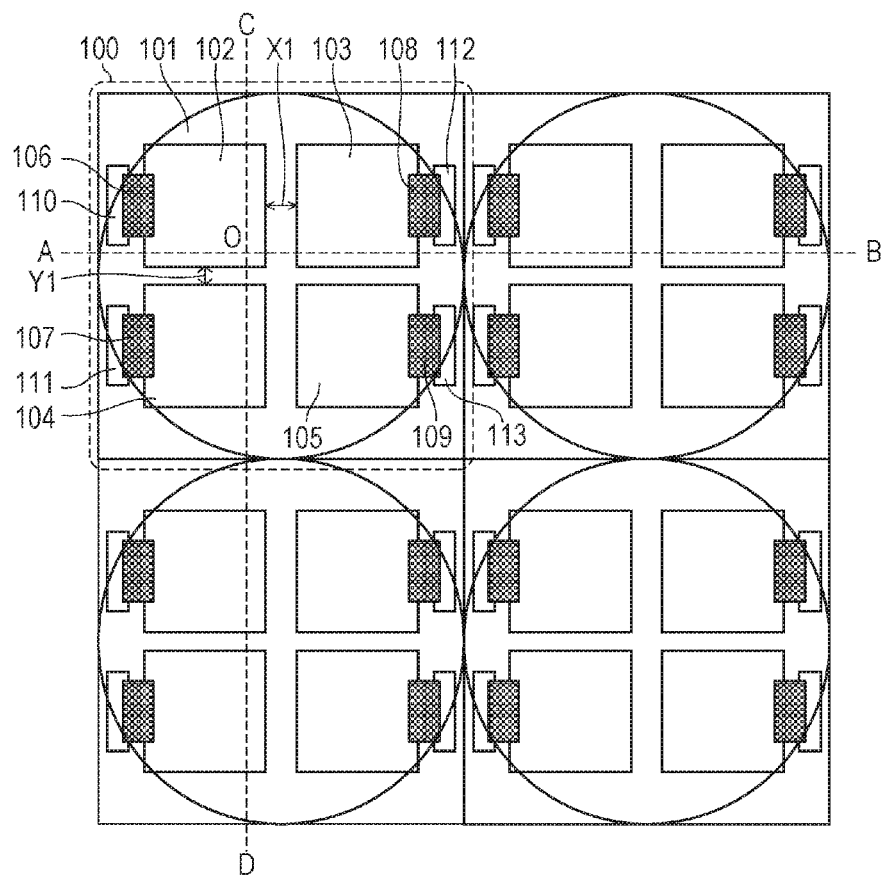
FIG. 1A is a top view of an example of photoelectric conversion units according to a first embodiment.

When the technique described above is used for focus ranging in an imaging apparatus, there is sometimes a need for, even with some sacrifice in focus-ranging precision in one direction parallel to an imaging plane, a high focusable subject luminance in other direction.

The focus of the embodiments below is on a technique for keeping a focusable subject luminance high in at least one direction parallel to an imaging plane, which is achieved by making potential barriers produced at regions between plural photoelectric conversion elements against signal charges different in height from each other.

The term "impurity concentration" used in the specification, claims, and drawings refers to so-called NET concentration, meaning net impurity concentration resulting from compensation by impurity of the opposite conductivity type. A region where P-type doped impurity concentration is higher than N-type doped impurity concentration is called as a P-type semiconductor region. A region where N-type doped impurity concentration is higher than P-type doped impurity concentration is called as an N-type semiconductor region.

When a semiconductor region that has a first conductivity type and a semiconductor region that has a second conductivity type are located adjacent to each other, it is possible to predetermine these two regions by means of mask patterns used during conductivity-type-imparting impurity doping.

In an imaging apparatus, by using, for focus ranging, a photoelectric conversion unit in which plural photoelectric conversion elements are arranged in a certain direction for one optical device, it is possible to perform the focus ranging in said certain direction. By arranging plural photoelectric conversion elements in an adjacent manner, with a certain photoelectric conversion element located adjacent in a different direction with respect to at least two photoelectric conversion elements, and by performing focus ranging in said at least two directions, it is possible to realize focus ranging for directional subject extension in more directions (two directions in this example) and increase focus-ranging precision for more subject patterns.

If plural photoelectric conversion elements differ in terms of characteristics such as sensitivity from one another, in some cases, one of the plural photoelectric conversion elements gets saturated earlier than the others. If one of the plural photoelectric conversion elements gets saturated in the photoelectric conversion unit having the structure described above, it follows that electric charges will leak to plural adjacent photoelectric conversion elements (at least two here). This causes a deviation, from the original unaffected value, in the value of the output of the adjacent photoelectric conversion units, resulting in a decrease in focus-ranging performance.

In view of the above, in an exemplary structure, the height of a potential barrier produced at a region between photoelectric conversion elements located adjacent to each other in a certain direction against a signal charge is less than the height of a potential barrier produced at a region between photoelectric conversion elements located adjacent to each other in a different direction against a signal charge.

In one embodiment, when one photoelectric conversion element gets saturated, the structure ensures that electric charges will leak to the photoelectric conversion element located adjacent to the saturated one in said certain direction, thereby preventing the charges from leaking to the photoelectric conversion element located adjacent to the saturated one in the different direction. This makes it possible to suppress a decrease in focus-ranging precision in one direction although focus-ranging precision in the other direction decreases when a certain photoelectric conversion element gets saturated. For this reason, in said one direction, it is possible to perform focus ranging up to a higher subject luminance.

The structure of a photoelectric converter according to some exemplary embodiments of the disclosure will now be explained.

First Embodiment

FIG. 1A is a schematic plain view, from the top, of an example of photoelectric conversion units 100 of an imaging apparatus according to the present embodiment. For each of plural photoelectric conversion units 100, corresponding one micro lens 101 is provided. Each photoelectric conversion unit includes a plurality of photodiodes as an example of photoelectric conversion elements. That is, plural photoelectric conversion elements of each photoelectric conversion unit are arranged at positions where light condensed by corresponding one micro lens enters. In FIG. 1A, a second direction, which is a direction that is parallel to a straight line going through C and D, is depicted as a vertical direction, and a first direction, which is a direction that is parallel to a straight line going through A and B, is depicted as a horizontal direction.

Each of transfer gates 106 to 109 transfers electric charges generated at the corresponding one of photodiodes (PD) 102 to 105 to the corresponding one of floating diffusion (FD) regions 110 to 113. In an example of a structure illustrated in FIG. 1A, a potential barrier against signal charges between the photodiodes 102 and 104 is lower than a potential barrier against signal charges between the photodiodes 102 and 103. The distance between the photodiodes 102 and 103 along the straight line going through A and B in FIG. 1A is X1. The distance between the photodiodes 102 and 104 along the straight line going through C and D in FIG. 1A is Y1. The distance X1 is greater than the distance Y1. As will be described later, a semiconductor region the conductivity type of which is the opposite of the conductivity type of the photodiodes 102 and 103 is provided between the photodiodes 102 and 103. Similarly, a semiconductor region the conductivity type of which is the opposite of the conductivity type of the photodiodes 102 and 104 is provided between the photodiodes 102 and 104. The distance X1 is the length of the semiconductor region the conductivity type of which is the opposite of the conductivity type of the photodiodes 102 and 103, and the distance Y1 is the length of the semiconductor region the conductivity type of which is the opposite of the conductivity type of the photodiodes 102 and 104.

Figure 1B:
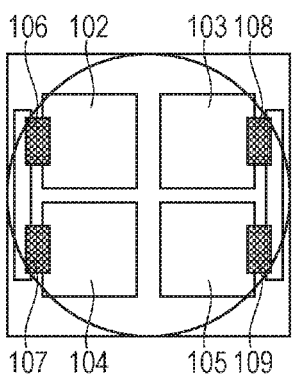
FIG. 1B is a top view of another example of photoelectric conversion units according to the first embodiment.

In this example, individual FD regions are provided for respective PDs independently. However, each FD region, or a single FD region, may be shared by more than one photodiode. FIG. 1B shows an example of sharing each FD region by two photodiodes arranged adjacent to each other in the second direction (i.e., vertical direction, C-D).

Figure 1C:
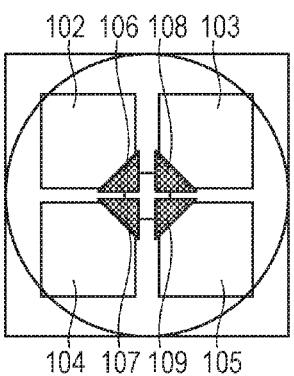
FIG. 1C is a top view of another example of photoelectric conversion units according to the first embodiment.

FIG. 1C shows an example of sharing a single FD region by four photodiodes. In the structure of FIG. 1C, there is a dead zone at the center of an imaging unit. However, for example, if the element is a back-lit imager, it is possible to employ this structure without any significant adverse effect on photoreception at photoelectric conversion elements. Though four photoelectric conversion units are illustrated, a larger number of photoelectric conversion units may be arranged.

Each photoelectric conversion unit 100 includes a micro lens 101, which is an example of an optical device, and four photodiodes 102 to 105 in the illustrated example. However, the scope of the aspect of the embodiments is not limited thereto. As long as at least two photodiodes are arranged in an adjacent manner in a different direction in relation to a certain photodiode, it suffices. That is, the number of photodiodes that are arranged two-dimensionally is three or more.

In the present embodiment, it is possible to acquire signal charges by using pupil division in the second direction (vertical direction) and the first direction (horizontal direction) orthogonal to the second direction. Therefore, it is possible to perform focus detection based on vertical/horizontal phase differences, that is, to perform so-called cross focusing.

Figure 2A:
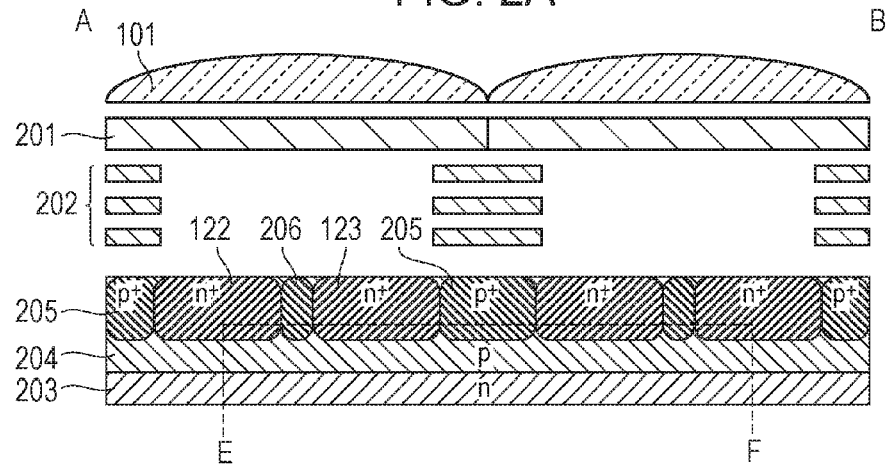
FIG. 2A is a cross-sectional view of an example of photoelectric conversion units according to the first embodiment.
Figure 2B:
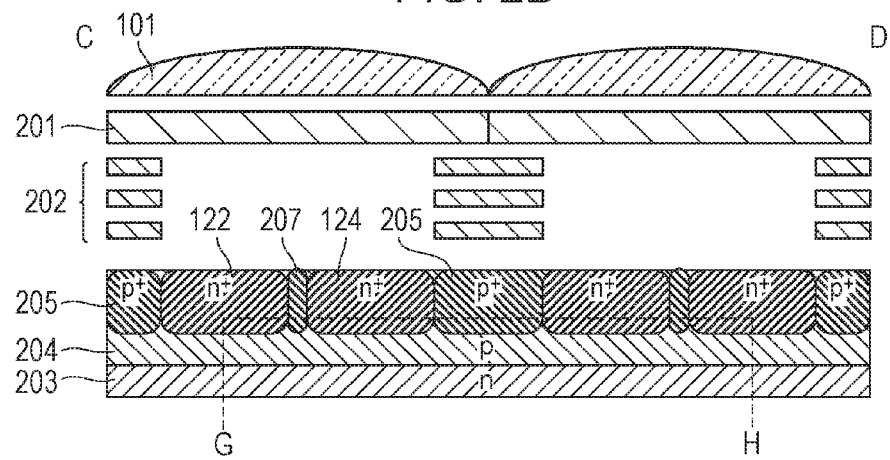
FIG. 2B is a cross-sectional view of an example of photoelectric conversion units according to the first embodiment.

FIG. 2A is a cross-sectional view of the structure of photoelectric conversion units taken along the broken line A-B of FIG. 1A. FIG. 2B is a cross-sectional view of the structure of photoelectric conversion units taken along the broken line C-D of FIG. 1A. FIG. 2 explained below corresponds to a case of a so-called vertical overflow drain (OFD) region for a semiconductor substrate whose OFD region is in the N type. However, the disclosed technique is applicable not only to a vertical OFD region but also to a horizontal OFD region.

First, the cross-sectional structure in FIG. 2A will now be explained. A color filter 201 and wiring 202 are provided between the micro lenses 101 and the semiconductor substrate. The wiring 202 includes, for example, lines for driving transistors in pixels, power lines, and the like.

In the direction perpendicular to the plain view of photoelectric conversion units illustrated in FIG. 1A, a P-type semiconductor region 204 is provided on an N-type semiconductor region 203 in the semiconductor substrate. Semiconductor regions each of which has a first conductivity type for constituting P-N junction with the P-type semiconductor region 204 are provided. Specifically, in this example, an N-type semiconductor region 122 (first semiconductor region) and an N-type semiconductor region 123 (second semiconductor region) are provided for P-N junction with the P-type semiconductor region 204. Each of the N-type semiconductor regions 122 and 123 is a low-potential region against electrons, which are signal charges, and collects the signal charges.

The P-type semiconductor region 204 and the N-type semiconductor region 122 constitute the photodiode 102 (first photoelectric conversion element). The P-type semiconductor region 204 and the N-type semiconductor region 123 constitute the photodiode 103 (second photoelectric conversion element).

A P-type semiconductor region 205 is provided between a photodiode of one of two photoelectric conversion units arranged adjacent to each other and a photodiode of the other. In FIG. 2A, the P-type semiconductor region 205 is provided between the photodiode 103 of the left photoelectric conversion unit 100 and the photodiode 102 of the right photoelectric conversion unit 100. In the photoelectric conversion unit 100, a P-type semiconductor region 206 (fourth semiconductor region), which is a semiconductor region that has a conductivity type that is different from the first conductivity type, is provided between the photodiodes 102 and 103. Each of the P-type semiconductor regions 205 and 206 is configured to function as a potential barrier against signal charges.

Each boundary between two semiconductor regions the conductivity types of which are different from each other, for example, the boundary between the first semiconductor region and the fourth semiconductor region, is a P-N junction interface.

Next, the cross-sectional structure in FIG. 2B will now be explained. In the description below, an explanation is omitted for regions having the same functions as those of FIG. 2A.

Semiconductor regions each of which has the first conductivity type for constituting P-N junction with the P-type semiconductor region 204 are provided. Specifically, the above-mentioned N-type semiconductor region 122 and an N-type semiconductor region 124 (third semiconductor region) are provided for P-N junction with the P-type semiconductor region 204. Each of the N-type semiconductor regions 122 and 124 is a region that has a low potential barrier against electrons, which are signal charges, and collects the signal charges.

The P-type semiconductor region 204 and the N-type semiconductor region 124 constitute the photodiode 104 (third photoelectric conversion element).

A P-type semiconductor region 207 (fifth semiconductor region), which is a semiconductor region that has a second conductivity type, which is different from the conductivity type of each N-type semiconductor region, is provided between the photodiodes 102 and 104. The P-type semiconductor region 207 is configured to function as a potential barrier against signal charges.

In the structure described above, when one of photodiodes arranged adjacent to each other gets saturated due to a sensitivity difference or a luminance difference between the photodiodes, charges generated after the saturation in excess of saturation charge sometimes get over potential barriers. When this phenomenon occurs, in some cases, a part of the generated charges leaks to the photodiode located inside the same photoelectric conversion unit.

For example, when charges generated and accumulated at the photodiode 102 are in excess of saturation charge, some of excess charges generated thereafter get over the potential barrier of the P-type semiconductor region 206 to leak to the photodiode 103 in some cases. Some of the excess charges get over the potential barrier of the P-type semiconductor region 207 to leak to the photodiode 104 in some cases.

In view of the above phenomenon, for example, by setting the height of the potential barrier of the P-type semiconductor region 207 against signal charges to be less than the height of the potential barrier of the P-type semiconductor region 206 against signal charges, it is possible to ensure that excess charges will leak to the photodiode 104. This suppresses the leakage of the excess charges to the photodiode 103. Therefore, it is possible to read out the original unaffected signal charges of the photodiode 103 properly, thereby preventing a decrease in focus-ranging precision.

As long as the leakage direction of charges accumulated in excess of saturation charge is predetermined, it suffices. Therefore, the height of the potential barrier of only a part, instead of a whole, of the P-type semiconductor region 207 may be less than the height of the potential barrier of the P-type semiconductor region 206.

In the present embodiment, the relationship between the height of the potential barrier of the P-type semiconductor region 206 and the height of the potential barrier of the P-type semiconductor region 207 is predetermined. Specifically, the P-type impurity concentration of the P-type semiconductor region 207 is lower than the P-type impurity concentration of the P-type semiconductor region 206. The difference may be impurity implantation concentration instead. The width of the P-type semiconductor region 206 in the direction of the line going through A and B and the width of the P-type semiconductor region 207 in the direction of the line going through C and D may be different from each other as illustrated in FIG. 1.

Figure 2C:
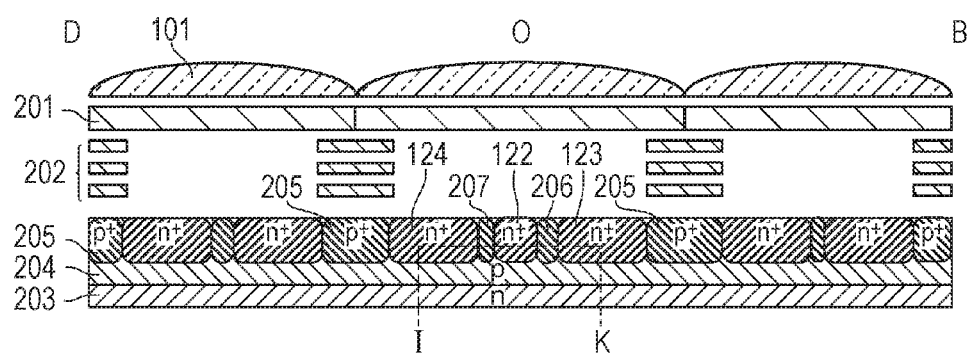
FIG. 2C is a cross-sectional view of an example of photoelectric conversion units according to the first embodiment.

FIG. 2C is a cross-sectional view of photoelectric conversion units taken along D-O-B of FIG. 1A. The length of the P-type semiconductor region 207 in the second direction (the direction of the line going through C and D in FIG. 1A) is less than the length of the P-type semiconductor region 206. Because of this structure, the height of the potential barrier of the P-type semiconductor region 207 is less than the height of the potential barrier of the P-type semiconductor region 206. Therefore, in the photoelectric conversion unit 100, excess charges generated in excess of saturation charge leak to the photodiode 104.

As long as signal charges leak in the second direction, it suffices. Therefore, the fifth semiconductor region (P-type semiconductor region 207) may have a region where impurity concentration is lower than the impurity concentration of the fourth semiconductor region (P-type semiconductor region 206).

It is possible to compare, in the fourth semiconductor region and the fifth semiconductor region, the length or impurity concentration of each region in the direction of leakage of accumulated charges at, for example, the positions of the same depth from the surface of the substrate.

The length of the fourth semiconductor region (P-type semiconductor region 206) in the first direction means the length from the first-semiconductor-region-side end of the fourth semiconductor region to the second-semiconductor-region-side end of the fourth semiconductor region. Similar definition holds true for the length of the fifth semiconductor region (P-type semiconductor region 207). For example, the length of the fifth semiconductor region (P-type semiconductor region 207) may be the length from the position of adjacency to a semiconductor region that has the first conductivity type (N-type semiconductor region 122) to another semiconductor region that has the first conductivity type (N-type semiconductor region 124).

Figure 3A:
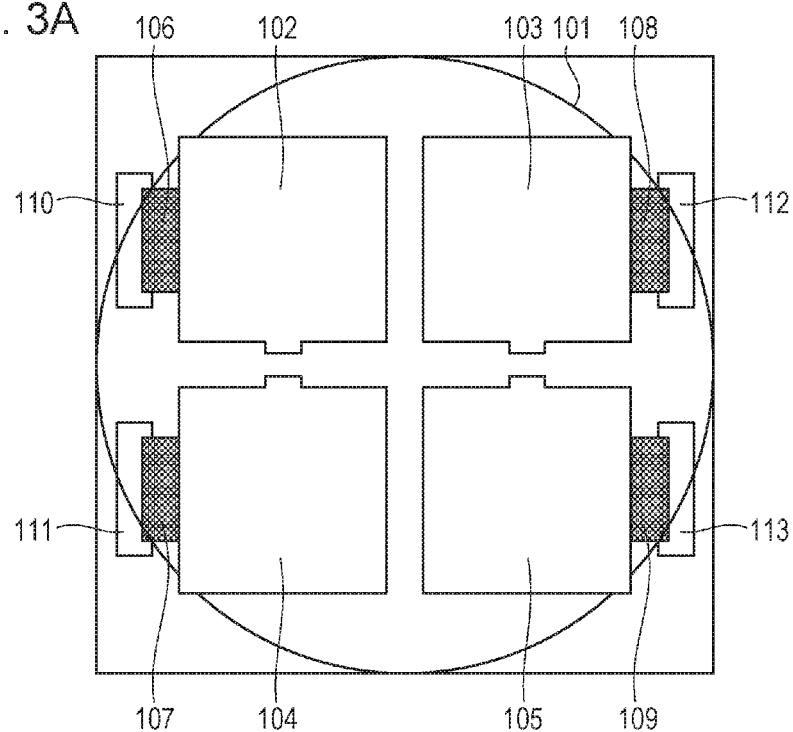
FIG. 3A is a top view of another example of photoelectric conversion units according to the first embodiment.
Figure 3B:
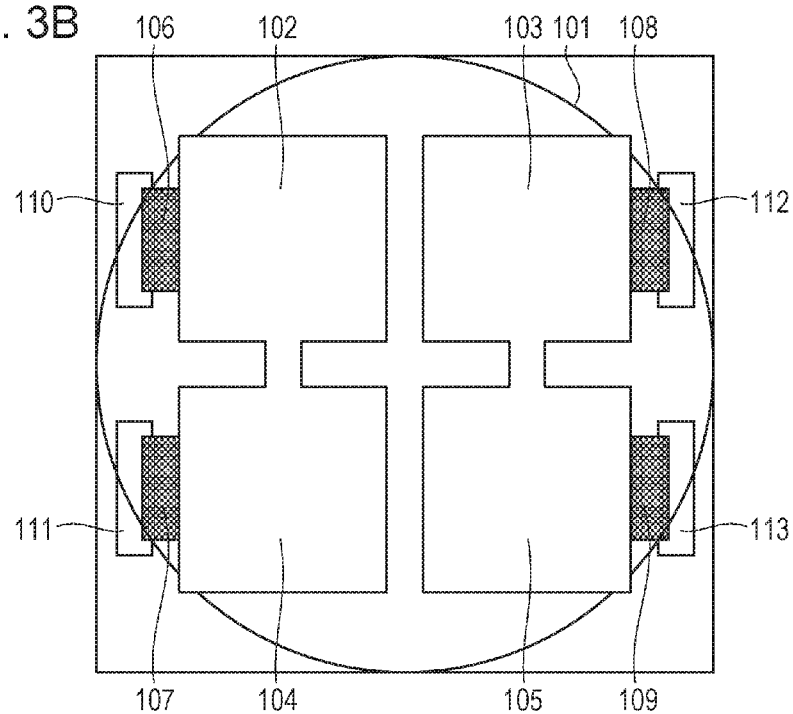
FIG. 3B is a top view of another example of photoelectric conversion units according to the first embodiment.

Each of FIGS. 3A and 3B is a top view of an example of a photoelectric conversion unit in which the shape of the N-type semiconductor region 122, 124 and the shape of the P-type semiconductor region 207 are modified. In the example illustrated in FIG. 3A, a part of the N-type semiconductor region 122, which is an example of the first semiconductor region, has a convex shape, a part of the N-type semiconductor region 124, which is an example of the third semiconductor region, has a convex shape, and these two convex parts are oriented toward each other in plain view. In other words, the length of at least a part of the fifth semiconductor region (the P-type semiconductor region 207) in the second direction (the direction of the line going through C and D) is less than the length of the other region in the fifth semiconductor region in the second direction.

In this modified structure, the length of the part ("concave" part corresponding to the convex parts) of the P-type semiconductor region 207, which is an example of the fifth semiconductor region, in the second direction is less than the length of the P-type semiconductor region 206, which is an example of the fourth semiconductor region, in the first direction (the direction of the line going through A and B).

As described above, the width of the P-type semiconductor region between the photodiodes arranged adjacent to each other does not have to be uniform. Each of the photodiodes may have a convex part in such a way as to be oriented toward each other. In another modification example, as illustrated in FIG. 3B, two photodiodes may be partially connected to each other. Concentration may be non-uniform in the depth direction.

Figure 4A:
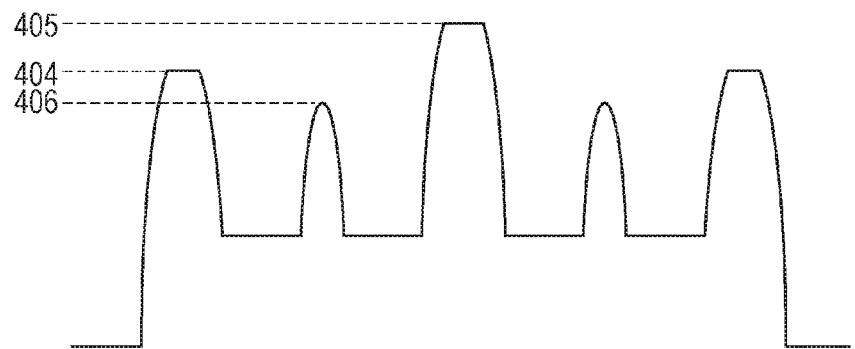
FIG. 4A is a schematic potential chart of an example of photoelectric conversion units according to the first embodiment.
Figure 4B:
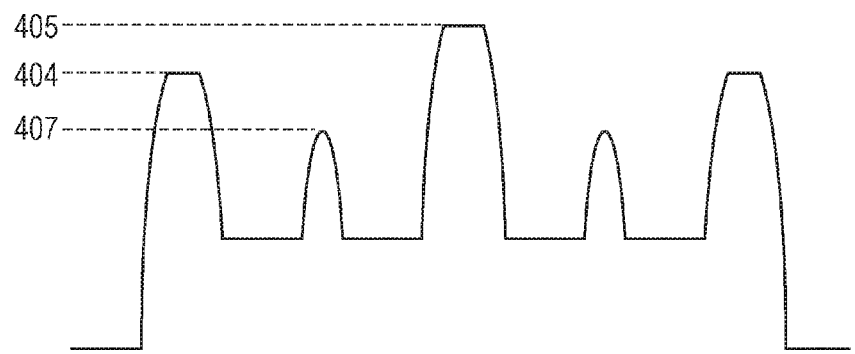
FIG. 4B is a schematic potential chart of an example of photoelectric conversion units according to the first embodiment.
Figure 4C:
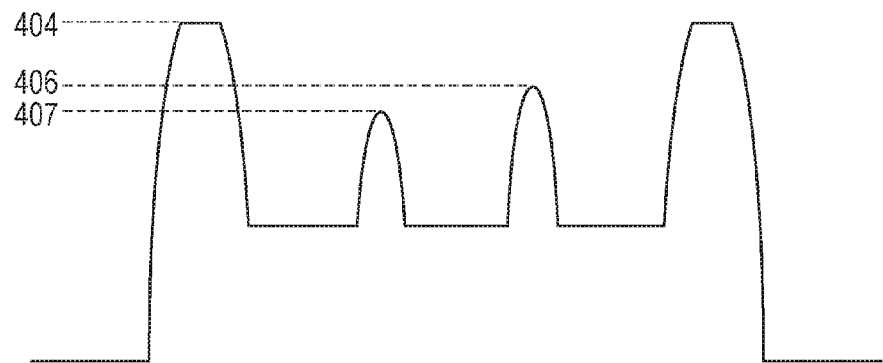
FIG. 4C is a schematic potential chart of an example of photoelectric conversion units according to the first embodiment.

FIGS. 4A, 4B, and 4C are schematic potential charts of an example of photoelectric conversion units according to the present embodiment. Specifically, potential against signal charges of semiconductor regions taken along the broken line E-F of FIG. 2A is schematically illustrated in FIG. 4A, and potential against signal charges of semiconductor regions taken along the broken line G-H of FIG. 2B is schematically illustrated in FIG. 4B. Potential against signal charges of semiconductor regions taken along the broken line I-K of FIG. 2C is schematically illustrated in FIG. 4C. The height of potential barriers produced at the P-type semiconductor regions 204, 205, 206, and 207 are shown as potential-barrier height 404, 405, 406, and 407, respectively.

The potential-barrier height 407 by the P-type semiconductor region 207 is less than the potential-barrier height 406 by the P-type semiconductor region 206. That is, the height of the potential barrier of, against signal charges, the region between the photodiodes 102 and 104, which are arranged adjacent to each other in the second direction, is less than the height of the potential barrier of, against signal charges, the region between the photodiodes 102 and 103, which are arranged adjacent to each other in the first direction.

The height of the potential barrier produced at, against signal charges, at least a part of the region between the photodiodes 102 and 104 in the second direction may be less than the height of the potential barrier produced at, against signal charges, the region between the photodiodes 102 and 103 in the first direction.

With the structure described above, in a case where any of photodiodes gets saturated, it is possible to ensure that charges will leak in the second direction before the leakage of the charges in the first direction.

Consider a case where the potential barrier produced at, against signal charges, the region between the photodiodes 102 and 103 in the first direction and the potential barrier produced at, against signal charges, the region between the photodiodes 102 and 104 in the second direction are equal in height. This means a case where, against signal charges, the potential barrier of the P-type semiconductor region 206 and the potential barrier of the P-type semiconductor region 207 are equal in height. The signal charges leak in the first direction and the second direction at the same time when the two potential barriers are equal in height. Once the leakage of the signal charges occurs in such a case, both focus-ranging performance in the first direction and focus-ranging performance in the second direction will decrease.

In this respect, by making the potential barrier against signal charges in the second direction different from the potential barrier against signal charges in the first direction, it is possible to ensure that excess charges generated in excess of saturation charge will flow in one direction (for example, in the second direction). This makes it possible to suppress the leakage of the excess charges in the other direction (first direction), thereby avoiding a deviation, from the original unaffected value, in the value of the signal charges of the photoelectric conversion unit located adjacent to the charge-saturated photoelectric conversion unit in the first direction.

Therefore, it is possible to avoid a decrease in focus-ranging precision in a certain direction. Specifically, in the example described here, it is possible to avoid a decrease in the performance of focus ranging for the subject extending in the second direction. Therefore, for the subject extending in the second direction, it is possible to perform focus ranging up to a higher luminance. In a case where the first direction is the horizontal direction and where the second direction is the vertical direction as in FIG. 1, it is possible to perform vertical-line detection.

Figure 1D:
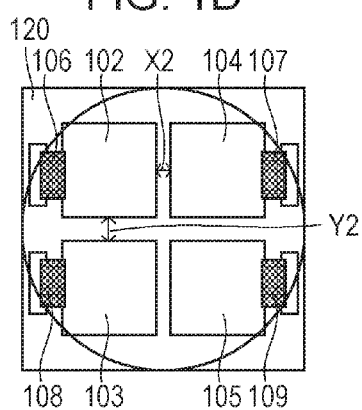
FIG. 1D is a top view of another example of photoelectric conversion units according to the first embodiment.

In general, it is believed that vertical lines are more common in comparison with horizontal lines, as in the natural world, artificial objects, and the like. This is the reason why a higher priority is given to vertical-line detection in the present embodiment. However, depending on the target of imaging or the purpose of use, a higher priority may be given to horizontal-line detection. That is, the first direction may be the vertical direction, and the second direction may be the horizontal direction. Any two directions intersecting with each other may be taken as the first direction and the second direction. An example of a pixel in which a priority is given to horizontal-line detection is illustrated in FIG. 1D. The directions of pupil division are also not limited to the vertical direction and the horizontal direction. The division may be in oblique directions, etc. In FIG. 1D, the distance between the photodiodes 102 and 104 along the straight line going through A and B mentioned in FIG. 1A is X2. Similarly, the distance between the photodiodes 102 and 103 along the straight line going through C and D mentioned in FIG. 1A is Y2. The distance Y2 is greater than the distance X2.

There is a possibility that some of charges generated at the saturated photodiode might leak to the N-type semiconductor region 203. In addition, there is a possibility that some of charges generated at the saturated photodiode might leak to the N-type floating diffusion region, which is the readout region to which the charges of the photodiode are transferred, by getting over the potential barrier under the non-illustrated transfer gate located therebetween. In particular, the N-type semiconductor region 203 and the floating diffusion region are able to function as overflow drain (OFD) regions, and the very first purpose of providing OFD regions is to discharge saturated charges. For this reason, it is likely that such leakage to OFD regions occur.

In view of the above, the potential-barrier height 407 by the P-type semiconductor region 207 should be less than the potential-barrier height 404 by the P-type semiconductor region 204. By this means, it is possible to ensure that, in a case where a PD gets saturated, electric charges will leak to an adjacent PD located inside the same photoelectric conversion unit before leakage to any OFD region.

Moreover, the potential-barrier height 405 by the P-type semiconductor region 205 should be greater than the potential-barrier height 407 by the P-type semiconductor region 207. Furthermore, the potential-barrier height 405 by the P-type semiconductor region 205 should be greater than the potential-barrier height 404 by the P-type semiconductor region 204.

With this structure, it is possible to offer high focus-ranging precision in at least two directions that are parallel to an imaging plane and, in a case of a high subject luminance, possible to keep a focusable state in at least one direction.

Figure 5:
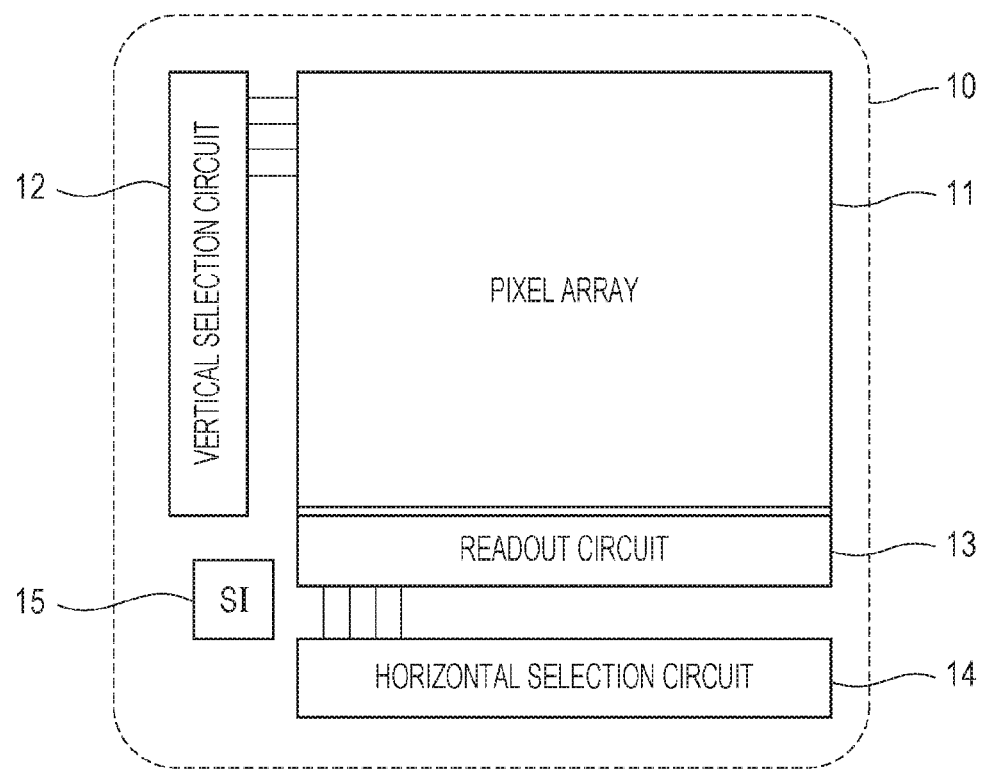
FIG. 5 is a block diagram of an example of an imaging apparatus according to the first embodiment.

With reference to FIG. 5, an example of an imaging apparatus that includes the photoelectric conversion units described above will now be explained. FIG. 5 is a block diagram that illustrates, as an example, an imaging apparatus according to the present embodiment.

In FIG. 5, an imaging apparatus 10 includes a pixel array 11 and a vertical selection circuit 12. The vertical selection circuit 12 selects a row in the pixel array 11. The pixel array 11 includes an array of plural photoelectric conversion units. In one embodiment, the plural photoelectric conversion units are arranged two-dimensionally.

A predetermined row is selected by the vertical selection circuit 12. Signals are outputted from photoelectric conversion units belonging to the selected predetermined row to vertical output lines. A vertical output line may be provided either for each column or for each group of plural columns. Alternatively, plural vertical output lines may be provided for each column of pixels. In a structure in one embodiment, plural vertical output lines are provided for each column of pixels. With such a structure, it is possible to increase the speed of signal readout processing.

The signals read out in parallel onto the vertical output lines are inputted into a column circuit 13. The column circuit 13 is capable of performing signal processing including signal amplification, analog-to-digital conversion, de-noising, and the like.

A horizontal selection circuit 14 selects the signals retained at the column circuit 13. The selection is sequential selection, random selection, or simultaneous selection. The selected signals are outputted to a non-illustrated horizontal output line.

A serial interface 15 performs external communication for, for example, deciding the mode of operation from the outside. The imaging apparatus 10 may include a timing generator configured to cue the timing for the vertical selection circuit 12, for the horizontal selection circuit 14, and for the column circuit 13, control circuitry, and the like in addition to those illustrated therein.

The block diagram of FIG. 5 can be applied to all of the embodiments described below. The terms "vertical" and "horizontal" are solely for easier understanding. They may be replaced with each other.

Second Embodiment

In the first embodiment, only one type of photoelectric conversion units is used. However, two types of photoelectric conversion units, or more, may be used. In the present embodiment, the differences from the first embodiment are explained. An explanation is omitted for regions of the same structure, the same material, or the same functions, etc. as those of the first embodiment.

In the present embodiment, two types of photoelectric conversion units are used. One of the two types consists of photoelectric conversion units 100 (first photoelectric conversion unit) for pixels for which a priority is given to the detection of first-direction component (vertical lines). The other type consists of photoelectric conversion units 120 (second photoelectric conversion unit) for pixels for which a priority is given to the detection of second-direction component (horizontal lines).

Figure 6A:
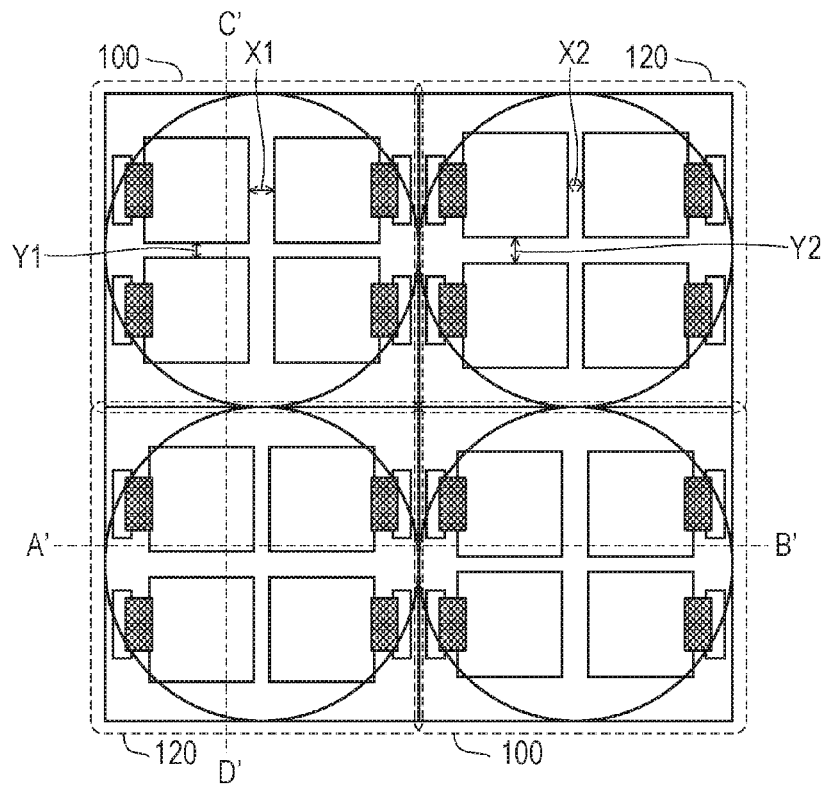
FIG. 6A is a top view of an example of photoelectric conversion elements according to a second embodiment.
Figure 6B:
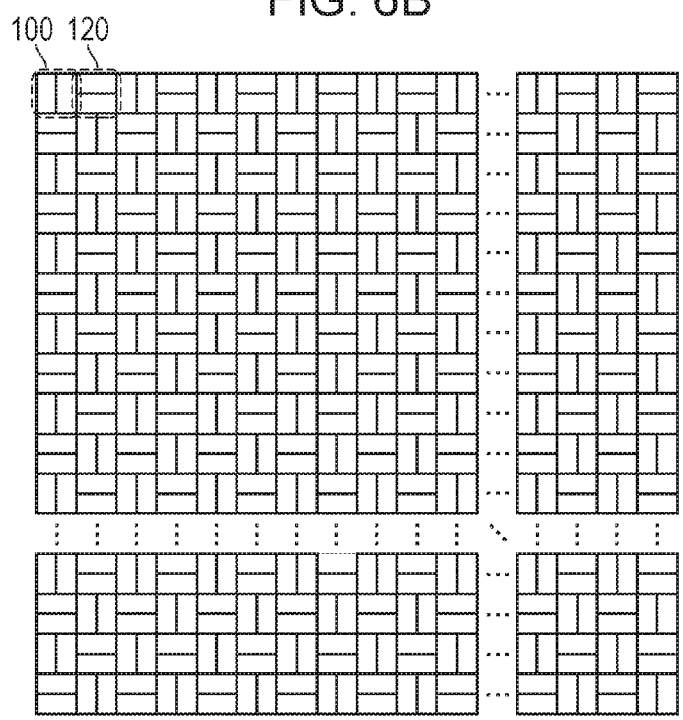
FIG. 6B is a conceptual array view, from the top, of an example of an imaging apparatus according to the second embodiment.

FIG. 6A is a schematic view of the top of photoelectric conversion units of an imaging apparatus according to the present embodiment. The photoelectric conversion units 100 and the photoelectric conversion units 120 are arranged to form a checkered pattern. FIG. 6B is a conceptual view of an imager taken from the top as a whole, wherein photoelectric conversion units are arranged in this way.

With this checkered layout, in a case where any of photodiodes gets saturated, it is possible to detect both the first-direction component (vertical lines) and the second-direction component (horizontal lines). Consequently, so-called cross focusing is realized.

Figure 7A:
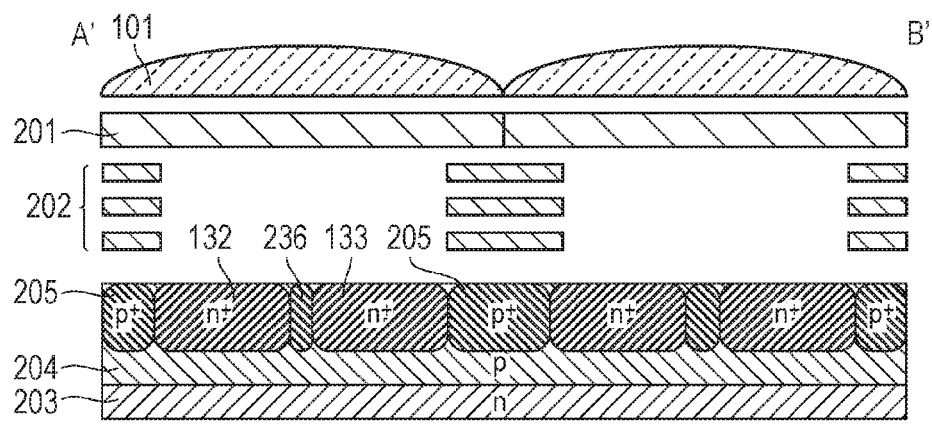
FIG. 7A is a cross-sectional view of an example of photoelectric conversion units according to the second embodiment.
Figure 7B:
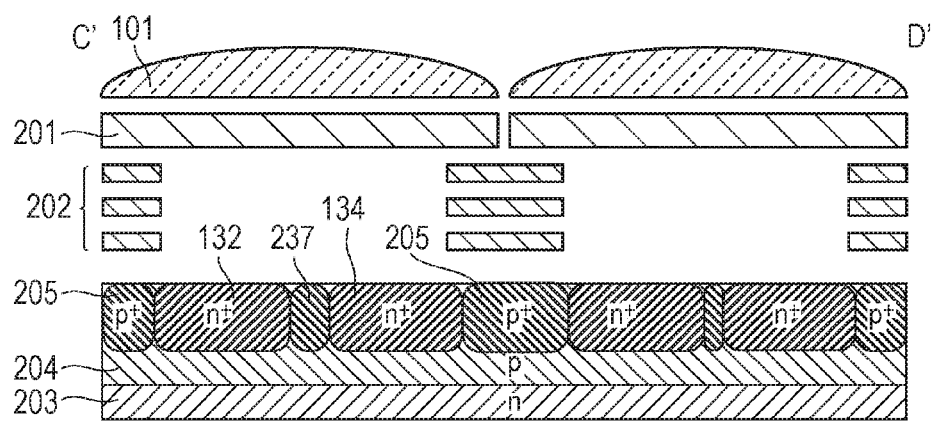
FIG. 7B is a cross-sectional view of an example of photoelectric conversion units according to the second embodiment.

FIG. 7A is a cross-sectional view of the structure of the second photoelectric conversion unit 120 taken along the broken line A'-B' of FIG. 6A. FIG. 7B is a cross-sectional view of the structure of the second photoelectric conversion unit 120 taken along the broken line C'-D' of FIG. 6A. The differences from the first photoelectric conversion unit 100 are explained here. An explanation is omitted for regions of the same structure, the same material, or the same functions.

As illustrated in FIG. 7A, the second photoelectric conversion unit 120 includes a micro lens, an N-type semiconductor region 132, which is an example of a sixth semiconductor region, an N-type semiconductor region 133, which is an example of a seventh semiconductor region, and a ninth semiconductor region, the conductivity type of which is different from the conductivity type of each of the sixth and seventh semiconductor regions. The ninth semiconductor region is a P-type semiconductor region 236. The P-type semiconductor region 236 is provided between the sixth and seventh semiconductor regions in the first direction (the direction of the line going through A' and B').

As illustrated in FIG. 7B, the second photoelectric conversion unit 120 further includes an N-type semiconductor region 134, which is an example of an eighth semiconductor region, and a P-type semiconductor region 237, which is an example of a tenth semiconductor region. The P-type semiconductor region 237 is provided between the sixth and eighth semiconductor regions in the second direction (the direction of the line going through C' and D').

In the second photoelectric conversion unit 120, the length of the P-type semiconductor region 236 in the first direction is less than the length of the P-type semiconductor region 237 in the second direction. Therefore, the height of the potential barrier produced at the ninth semiconductor region against signal charges is less than the height of the potential barrier produced at the tenth semiconductor region against signal charges.

In the example described here, potential-barrier height is predetermined in terms of the length of the P-type semiconductor region 236 in the first direction and the length of the P-type semiconductor region 237 in the second direction, that is, in terms of the shape of the N-type semiconductor regions 132, 133, 134 and the shape of the P-type semiconductor regions 236 and 237. However, any alternative structure may be adopted for the second photoelectric conversion unit 120 as long as the height of the potential barrier of the ninth semiconductor region against signal charges is less than the height of the potential barrier of the tenth semiconductor region against signal charges. Therefore, it is possible to adjust potential-barrier height by, for example, setting the size, shape, or impurity concentration of each semiconductor region, as may be done for the photoelectric conversion unit 100.

Figure 8A:
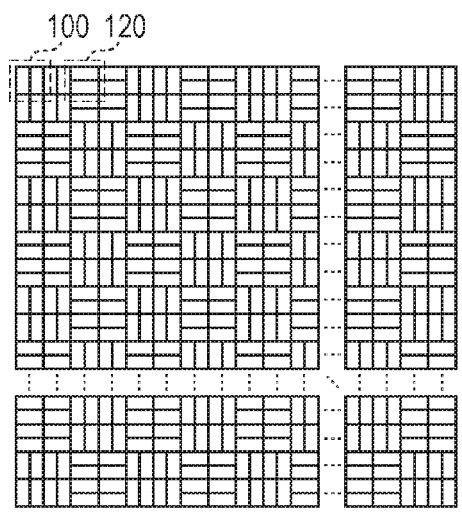
FIG. 8A is a conceptual array view, from the top, of another example of an imaging apparatus according to the second embodiment.

In an imaging element using color information, a Bayer pattern is sometimes adopted for a color filter array. In the arrangement illustrated in FIG. 6B, the cycle of color filter array coincides with the cycle of the array of the photoelectric conversion elements, resulting in the lack of balance in pixel assignment; for example, horizontal-line detection pixels only are assigned to green. To avoid such unbalanced assignment, the cyclic array may be modified as illustrated in FIG. 8A. In this example, four first photoelectric conversion units 100 arranged in a matrix of two adjacent to each other in the first direction and two adjacent to each other in the second direction, that is, a 2×2 array block, is defined as a first set each. Similarly, four second photoelectric conversion units 120 arranged in a matrix of two adjacent to each other in the first direction and two adjacent to each other in the second direction, that is, a 2×2 array block, is defined as a second set each. In FIG. 8A, the first sets and the second sets are arranged to form a checkered pattern.

Figure 8B:
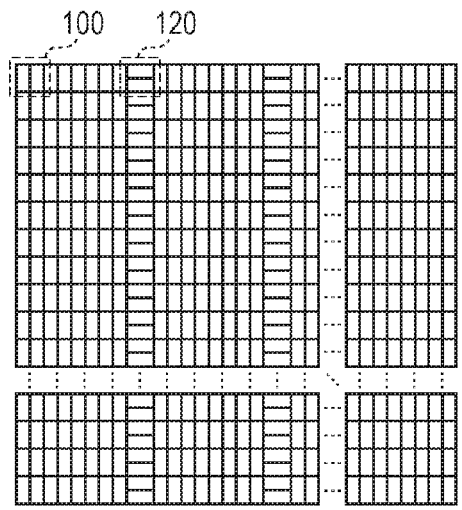
FIG. 8B is a conceptual array view, from the top, of another example of an imaging apparatus according to the second embodiment.
Figure 8C:
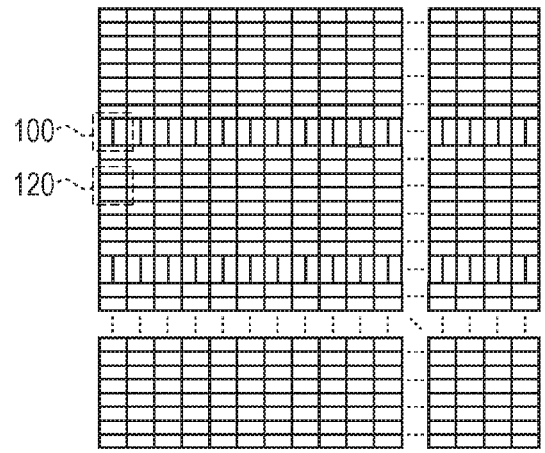
FIG. 8C is a conceptual array view, from the top, of another example of an imaging apparatus according to the second embodiment.

However, in the arrangement illustrated in FIG. 8A, the pitch of the same type of photoelectric conversion units is longer. The longer pitch might result in a decrease in focus-ranging performance. One possible solution is to, if the importance is on vertical-line detection, reduce the percentage of horizontal-line detection pixels and arrange them in lines in the vertical direction as illustrated in FIG. 8B. That is, in FIG. 8B, some first photoelectric conversion units 100 are arranged successively on each row in the first direction. If the importance is on horizontal-line detection, the arrangement illustrated in FIG. 8C is a possible solution. That is, in FIG. 8C, some second photoelectric conversion units 120 are arranged successively on each column in the second direction.

Third Embodiment

Figure 9:
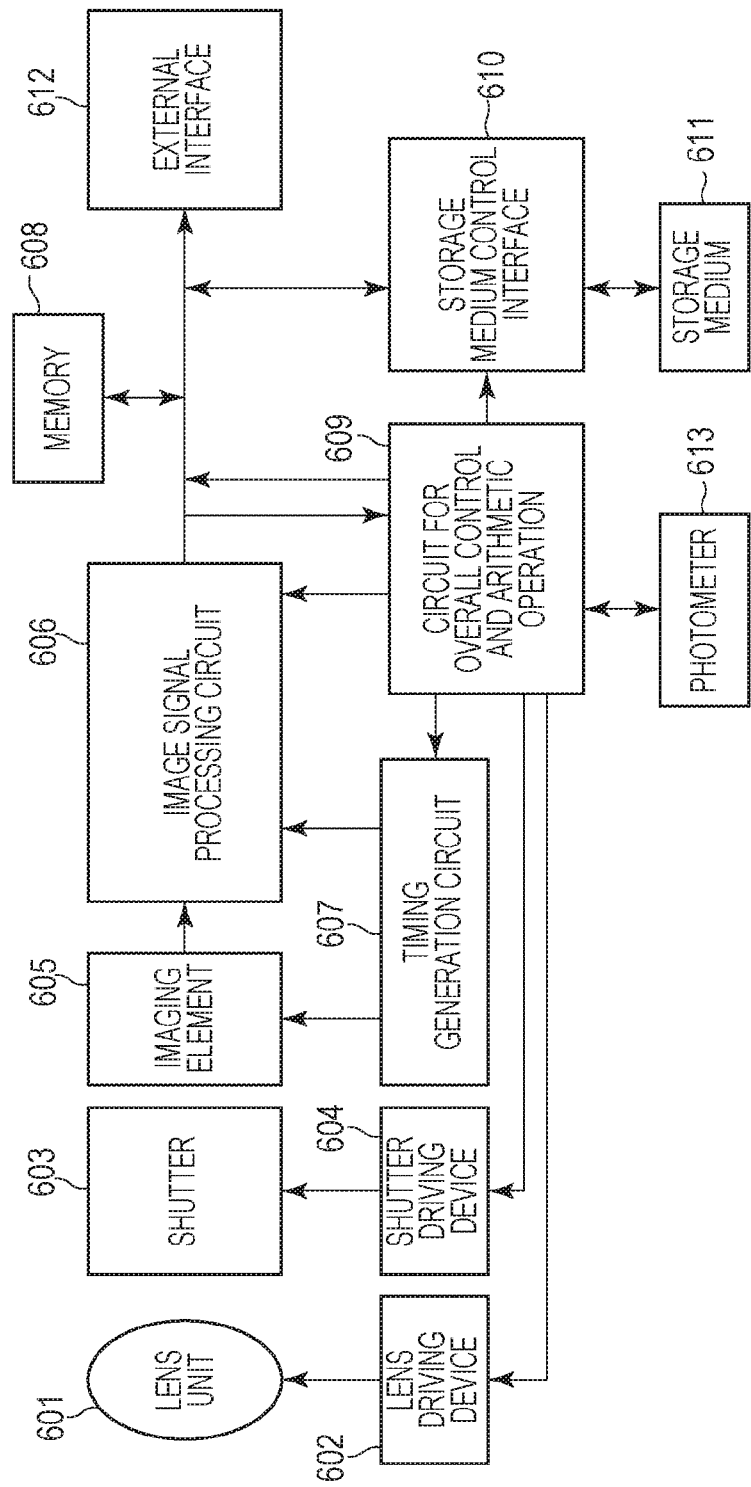
FIG. 9 is a block diagram of an example of an imaging system according to a third embodiment.

An example of an imaging system to which an imaging apparatus according to each of the foregoing embodiments can be applied is illustrated in FIG. 9.

In FIG. 9, a lens unit 601 forms an optical image of the subject on an imaging element 605. A lens driving device 602 performs zoom control, focus control, aperture control, and the like. A mechanical shutter 603 is controlled by a shutter controller 604. The imaging element 605 acquires, as an image signal, the subject image formed by the lens unit 601. An image signal processing circuit 606 performs various kinds of correction processing on the image signal outputted from the imaging element 605, and performs data compression. A timing generation circuit 607 is a driver that outputs various timing signals to the imaging element 605 and the image signal processing circuit 606. A control circuit 609 performs various kinds of arithmetic operation and controls the entire imaging apparatus. A memory 608 is for temporary storage of image data. An interface 610 is a writer/reader for a storage medium 611. The storage medium 611 is a detachable storage which image data is written into or read out of, for example, a semiconductor memory. A display unit 612 displays various kinds of information and captured images.

Next, the photographing operation of a digital camera that has the structure described above will now be explained.

When the main power is turned on, the control system of the camera is powered on, and imaging circuitry including the image signal processing circuit 606 is also powered on.

When a release button (not illustrated) is pressed, the image signal processing circuit 606 performs focus-ranging arithmetic operation on the basis of the data from the imaging element 605, and the control circuit 609 calculates the distance to the subject on the basis of the focus-ranging result. After that, the lens unit 601 is driven by the lens driving device 602, and it is determined whether the subject is in focus or not. By this means, a digital camera using a solid state imager according to any of the disclosed and other embodiments is capable of performing bringing-into-focus operation at a high speed with high precision. Moreover, even in a case of a high subject luminance, it is possible to perform bringing-into-focus operation with high precision for component extending in a particular direction.

In a solid state imager that processes signals produced by plural photoelectric conversion elements as one pixel signal, in a case where there is any difference in sensitivity or in the amount of incident light between the plural photoelectric conversion elements, the technique disclosed herein makes it possible to suppress a decrease in focus-ranging precision in a certain direction (for example, in the vertical or horizontal direction).

While the disclosure has been described with reference to exemplary embodiments, it is to be understood that the disclosure is not limited to the disclosed exemplary embodiments. The scope of the following claims is to be accorded the broadest interpretation so as to encompass all such modifications and equivalent structures and functions.

This application claims the benefit of Japanese Patent Application No. 2016-045994 filed Mar. 9, 2016, which is hereby incorporated by reference herein in its entirety.

What is claimed is:

1. An imaging apparatus, comprising:
a plurality of first photoelectric conversion units, each including,
one micro lens;
a first photoelectric conversion element that includes a first semiconductor region that accumulates a signal charge, the first semiconductor region having a first conductivity type;
a second photoelectric conversion element that includes a second semiconductor region that accumulates a signal charge, the second semiconductor region being located next to the first semiconductor region in a first direction, the second semiconductor region having the first conductivity type;
a third photoelectric conversion element that includes a third semiconductor region that accumulates a signal charge, the third semiconductor region being located next to the first semiconductor region in a second direction intersecting with the first direction, the third semiconductor region having the first conductivity type;
a fourth semiconductor region that is located between the first semiconductor region and the second semiconductor region and has a second conductivity type; and
a fifth semiconductor region that is located between the first semiconductor region and the third semiconductor region and has the second conductivity type,
wherein the first photoelectric conversion element, the second photoelectric conversion element, and the third photoelectric conversion element are arranged at positions where light condensed by the one micro lens enters, and
wherein a length of the fifth semiconductor region in the second direction is less than a length of the fourth semiconductor region in the first direction.

2. The imaging apparatus according to claim 1,
wherein impurity concentration of at least a part of the fifth semiconductor region is lower than impurity concentration of the fourth semiconductor region.

3. The imaging apparatus according to claim 1,
wherein a height of a potential barrier produced at the fifth semiconductor region against the signal charge is less than a height of a potential barrier produced at the fourth semiconductor region against the signal charge.

4. The imaging apparatus according to claim 1,
wherein impurity concentration of the fifth semiconductor region is lower than impurity concentration of the fourth semiconductor region.

5. An imaging apparatus, comprising:
a plurality of first photoelectric conversion units, each including,
one micro lens;
a first photoelectric conversion element that includes a first semiconductor region that accumulates a signal charge, the first semiconductor region having a first conductivity type;
a second photoelectric conversion element that includes a second semiconductor region that accumulates a signal charge, the second semiconductor region being located next to the first semiconductor region in a first direction, the second semiconductor region having the first conductivity type;
a third photoelectric conversion element that includes a third semiconductor region that is located next to the first semiconductor region in a second direction intersecting with the first direction, the third semiconductor region having the first conductivity type;
a first transfer gate connected to the first photoelectric conversion element;
a second transfer gate connected to the second photoelectric conversion element;
a third transfer gate connected to the third photoelectric conversion element;
a fourth semiconductor region that is located between the first semiconductor region and the second semiconductor region and has a second conductivity type; and
a fifth semiconductor region that is located between the first semiconductor region and the third semiconductor region and has the second conductivity type,
wherein a part of the fourth semiconductor region is located between the first transfer gate and the second transfer gate,
wherein a part of the fifth semiconductor region is located between the first transfer gate and the third transfer gate,
wherein the first photoelectric conversion element, the second photoelectric conversion element, and the third photoelectric conversion element are arranged at positions where light condensed by the one micro lens enters, and
wherein a height of a potential barrier produced at, against the signal charge, at least a part of the fifth semiconductor region is less than a height of a potential barrier produced at the fourth semiconductor region against the signal charge.

6. The imaging apparatus according to claim 5,
wherein the fifth semiconductor region includes a region whose length in the second direction is less than a length of the fourth semiconductor region in the first direction.

7. The imaging apparatus according to claim 5,
wherein the fifth semiconductor region includes a region whose length in the second direction is less than a length of other region of the fifth semiconductor region in the second direction.

8. The imaging apparatus according to claim 5,
wherein impurity concentration of the fifth semiconductor region is lower than impurity concentration of at least a part of the fourth semiconductor region.

9. The imaging apparatus according to claim 5,
wherein the height of the potential barrier produced at the fifth semiconductor region against the signal charge is less than the height of the potential barrier produced at the fourth semiconductor region against the signal charge.

10. The imaging apparatus according to claim 5,
wherein a length of the fifth semiconductor region in the second direction is less than a length of the fourth semiconductor region in the first direction.

11. The imaging apparatus according to claim 5,
wherein impurity concentration of the fifth semiconductor region is lower than impurity concentration of the fourth semiconductor region.

12. The imaging apparatus according to claim 5, further comprising:
a plurality of second photoelectric conversion units, each including,
one micro lens;
a fourth photoelectric conversion element that includes a sixth semiconductor region;

a fifth photoelectric conversion element that is located next to the fourth photoelectric conversion element in the first direction and includes a seventh semiconductor region;
a sixth photoelectric conversion element that is located next to the fourth photoelectric conversion element in the second direction and includes an eighth semiconductor region;
a ninth semiconductor region that is located between the sixth semiconductor region and the seventh semiconductor region; and
a tenth semiconductor region that is located between the sixth semiconductor region and the eighth semiconductor region,
wherein the fourth photoelectric conversion element, the fifth photoelectric conversion element, and the sixth photoelectric conversion element are arranged at positions where light condensed by the one micro lens enters,
wherein each of the sixth semiconductor region, the seventh semiconductor region, and the eighth semiconductor region has the first conductivity type,
wherein each of the ninth semiconductor region and the tenth semiconductor region has the second conductivity type,
wherein a height of a potential barrier produced at at least a part of the ninth semiconductor region against the signal charge is less than a height of a potential barrier produced at the tenth semiconductor region against the signal charge, and
wherein the signal charge has the first conductivity type.

13. The imaging apparatus according to claim 12,
wherein the plurality first photoelectric conversion units and the plurality second photoelectric conversion units are arranged to form a checkered pattern.

14. The imaging apparatus according to claim 12,
wherein there is a plurality of first sets in each of which four of the first photoelectric conversion units are arranged in a matrix of two adjacent to each other in the first direction and two adjacent to each other in the second direction;
wherein there is a plurality of second sets in each of which four of the second photoelectric conversion units are arranged in a matrix of two adjacent to each other in the first direction and two adjacent to each other in the second direction; and
wherein the first sets and the second sets are arranged to form a checkered pattern.

15. The imaging apparatus according to claim 12,
wherein some the first photoelectric conversion units are arranged successively in the first direction.

16. The imaging apparatus according to claim 5,
wherein each of the plurality of first photoelectric conversion units further includes a floating diffusion region,
the floating diffusion region is connected to the first transfer gate, the second transfer gate, and the third transfer gate.

17. An imaging apparatus, comprising:
a plurality of first photoelectric conversion units, each including,
one micro lens;
a first photoelectric conversion element that includes a first semiconductor region that accumulates a signal charge, the first semiconductor region having a first conductivity type;
a second photoelectric conversion element that includes a second semiconductor region that accumulates a signal charge, the second semiconductor region being located next to the first semiconductor region in a first direction, the second semiconductor region having the first conductivity type;
a third photoelectric conversion element that includes a third semiconductor region that accumulates a signal charge, the third semiconductor region being located next to the first semiconductor region in a second direction intersecting with the first direction, the third semiconductor region having the first conductivity type;
a first transfer gate connected to the first photoelectric conversion element;
a second transfer gate connected to the second photoelectric conversion element;
a third transfer gate connected to the third photoelectric conversion element;
a fourth semiconductor region that is located between the first semiconductor region and the second semiconductor region and has a second conductivity type; and
a fifth semiconductor region that is located between the first semiconductor region and the third semiconductor region and has the second conductivity type,
wherein a part of the fourth semiconductor region is located between the first transfer gate and the second transfer gate,
wherein a part of the fifth semiconductor region is located between the first transfer gate and the third transfer gate,
wherein the first photoelectric conversion element, the second photoelectric conversion element, and the third photoelectric conversion element are arranged at positions where light condensed by the one micro lens enters, and
wherein the fifth semiconductor region includes a region whose impurity concentration is lower than impurity concentration of the fourth semiconductor region.

18. The imaging apparatus according to claim 17,
wherein the impurity concentration of the fifth semiconductor region is lower than the impurity concentration of the fourth semiconductor region.

19. The imaging apparatus according to claim 17, further comprising:
a plurality of second photoelectric conversion units, each including,
one micro lens;
a fourth photoelectric conversion element that includes a sixth semiconductor region;
a fifth photoelectric conversion element that is located next to the fourth photoelectric conversion element in the first direction and includes a seventh semiconductor region;
a sixth photoelectric conversion element that is located next to the fourth photoelectric conversion element in the second direction and includes an eighth semiconductor region;
a ninth semiconductor region that is located between the sixth semiconductor region and the seventh semiconductor region; and
a tenth semiconductor region that is located between the sixth semiconductor region and the eighth semiconductor region,
wherein the fourth photoelectric conversion element, the fifth photoelectric conversion element, and the sixth photoelectric conversion element are arranged at positions where light condensed by the one micro lens enters,
wherein each of the sixth semiconductor region, the seventh semiconductor region, and the eighth semiconductor region has the first conductivity type,
wherein each of the ninth semiconductor region and the tenth semiconductor region has the second conductivity type,
wherein the ninth semiconductor region includes a region whose impurity concentration of the second conductivity type is lower than impurity concentration of the second conductivity type of the tenth semiconductor region, and
wherein the signal charge has the first conductivity type.

20. The imaging apparatus according to claim 19,
wherein there is a plurality of first sets in each of which four of the first photoelectric conversion units are arranged in a matrix of two adjacent to each other in the first direction and two adjacent to each other in the second direction;
wherein there is a plurality of second sets in each of which four of the second photoelectric conversion units are arranged in a matrix of two adjacent to each other in the first direction and two adjacent to each other in the second direction; and
wherein the first sets and the second sets are arranged to form a checkered pattern.

21. The imaging apparatus according to claim 17,
wherein each of the plurality of first photoelectric conversion units further includes a floating diffusion region,
the floating diffusion region is connected to the first transfer gate, the second transfer gate, and the third transfer gate.

22. An imaging system, comprising:
a signal processing circuit configured to perform focus ranging; and
an imaging apparatus configured to output a signal used for the focus ranging by the signal processing circuit, the imaging apparatus including,
   a plurality of first photoelectric conversion units, each including,
      one micro lens;
      a first photoelectric conversion element that includes a first semiconductor region that accumulates a signal charge, the first semiconductor region having a first conductivity type;
      a second photoelectric conversion element that includes a second semiconductor region that accumulates a signal charge, the second semiconductor region being located next to the first semiconductor region in a first direction, the second semiconductor region having the first conductivity type;
      a third photoelectric conversion element that includes a third semiconductor region that accumulates a signal charge, the third semiconductor region being located next to the first semiconductor region in a second direction intersecting with the first direction, the third semiconductor region having the first conductivity type;
      a fourth semiconductor region that is located between the first semiconductor region and the second semiconductor region and has a second conductivity type; and
      a fifth semiconductor region that is located between the first semiconductor region and the third semiconductor region and has the second conductivity type,
   wherein the first photoelectric conversion element, the second photoelectric conversion element, and the third photoelectric conversion element are arranged at positions where light condensed by the one micro lens enters, and
   wherein a length of the fifth semiconductor region in the second direction is less than a length of the fourth semiconductor region in the first direction.

23. An imaging apparatus, comprising:
a plurality of first photoelectric conversion units, each including, one micro lens;
   a first photoelectric conversion element that includes a first semiconductor region that accumulates a signal charge, the first semiconductor region having a first conductivity type;
   a second photoelectric conversion element that includes a second semiconductor region that accumulates a signal charge, the second semiconductor region being located next to the first semiconductor region in a first direction, the second semiconductor region having the first conductivity type;
   a third photoelectric conversion element that includes a third semiconductor region that accumulates a signal charge, the third semiconductor region being located next to the first semiconductor region in a second direction intersecting with the first direction, the third semiconductor region having the first conductivity type;
   a first transfer gate connected to the first photoelectric conversion element
   a second transfer gate connected to the second photoelectric conversion element,
   a third transfer gate connected to the third photoelectric conversion element,
   a fourth semiconductor region that is located between the first semiconductor region and the second semiconductor region and has a second conductivity type; and
   a fifth semiconductor region that is located between the first semiconductor region and the third semiconductor region and has the second conductivity type,
wherein
in planar view, a first line passes through the first transfer gate, the first semiconductor region, the fourth semiconductor region, the second semiconductor region, and the second transfer gate in this order, and
in planar view, a second line passes through the first semiconductor region, the fifth semiconductor region, and the third semiconductor region in this order, and
wherein one of the fourth semiconductor region and the fifth semiconductor region includes a region whose impurity concentration is lower than impurity concentration of the other of the fourth semiconductor region and the fifth semiconductor region.

* * * * *